United States Patent [19]

Benjamin

[11] Patent Number: 5,455,448

[45] Date of Patent: Oct. 3, 1995

[54] BIPOLAR, MONOLITHIC, HIGH-POWER RF TRANSISTOR WITH ISOLATED TOP COLLECTOR

[75] Inventor: Jim Benjamin, Verona, N.J.

[73] Assignee: SGS-Thomson Microelectronics, Inc., Carrollton, Tex.

[21] Appl. No.: 340,799

[22] Filed: Nov. 16, 1994

Related U.S. Application Data

[63] Continuation of Ser. No. 939,997, Sep. 3, 1992, abandoned.

[51] Int. Cl.⁶ .......................... H01L 29/72; H01L 27/04; H01L 27/12
[52] U.S. Cl. .......................... 257/565; 257/276; 257/586; 257/587; 257/712
[58] Field of Search .................. 357/34, 55, 50; 257/586, 587, 506, 526, 565, 621, 622, 767, 774, 584, 276, 523, 559, 627, 712

[56] References Cited

U.S. PATENT DOCUMENTS

| | | | |
|---|---|---|---|
| 3,651,434 | 3/1972 | McGeough et al. | 333/84 M |
| 3,768,150 | 10/1973 | Sloan, Jr. et al. | 29/578 |
| 3,868,720 | 2/1975 | New et al. | 357/34 |
| 3,895,392 | 7/1975 | Polata et al. | 357/44 |
| 3,986,196 | 10/1976 | Decker et al. | 257/276 |
| 4,016,643 | 4/1977 | Pucel et al. | 257/276 |
| 4,161,740 | 7/1979 | Frey | 357/36 |
| 4,168,507 | 9/1979 | Yester, Jr. | 357/51 |
| 4,454,646 | 6/1984 | Joy et al. | 29/576 |
| 4,504,332 | 3/1985 | Shinada | 148/187 |
| 4,639,760 | 1/1987 | Granberg et al. | 357/75 |
| 4,651,410 | 3/1987 | Feygenson | 29/576 J |
| 4,688,069 | 8/1987 | Joy et al. | 357/34 |
| 4,812,890 | 3/1989 | Feygenson | 357/34 |
| 5,109,262 | 4/1992 | Kadota et al. | 357/34 |
| 5,187,554 | 2/1993 | Miwa | 307/586 |

FOREIGN PATENT DOCUMENTS

| | | |
|---|---|---|
| 0439163 | 7/1991 | European Pat. Off. . |
| 54-151377 | 11/1979 | Japan ..................... 257/587 |
| 55-117270 | 9/1980 | Japan ..................... 257/587 |
| 60-038889 | 2/1985 | Japan . |
| 1244759 | 9/1971 | United Kingdom ......... 257/586 |
| 8802554 | 4/1988 | WIPO . |

OTHER PUBLICATIONS

Electronic Letters, K. Morizuka et al., vol. 22, No. 6, Mar. 13, 1986, pp. 315–316.

N. Dye & D. Schnell, "RF Power Transistors Catapult into High-Power Systems," Microwaves & RF at 344–351 (Mar. 1987).

S. Koshevaya et al., "High-Speed Broad Band Modulators Based on P–I–N Structures," Radioelectronics & Communications Systems, vol. 32, No. 10, at 11–19 (Allerton Press, Inc. 1989).

J. Browne, "RF Devices Gain Higher Power Levels," Microwaves & RF at 148–153 (Nov. 1987).

K. Platzoder & H. Weidlich, "New RF Transistors With Improved Noise Figure & Gain," Siemens Components XXIII, No. 6, at 256–259 (1988).

N. Dye, "Packaging RF Transistors," Electronic Packaging & Production at 82–83 (Sep. 1987).

Primary Examiner—Rolf Hille
Assistant Examiner—David Ostrowski
Attorney, Agent, or Firm—Allan Ratner; Renee M. Larson; Lisa K. Jorgenson

[57] ABSTRACT

A high frequency, high power transistor is vertically isolated by providing a thermally conductive, electrically insulating substrate, upon which the transistor components (including collector, base, and emitter) are grown, positioned directly on the heat sink and a planar top surface formed on the transistor by the base metal contact, the emitter metal contact, and the collector metal contact. Vertical isolation improves the thermal management capabilities of the transistor. Moreover, such a vertically isolated transistor is well-adapted for lateral isolation, which solves the capacitance problems inherent in conventional devices.

20 Claims, 1 Drawing Sheet

BIPOLAR, MONOLITHIC, HIGH-POWER RF TRANSISTOR WITH ISOLATED TOP COLLECTOR

This is a Continuation of application Ser. No. 07/939, 997, filed on Sept. 3, 1992, now abandoned.

FIELD OF THE INVENTION

This invention relates to high frequency power transistors and, more specifically, to bipolar, monolithic, high-power RF transistors with isolated top collector contacts having improved thermal management as well as saturated power, gain, efficiency, and reliability improvements.

BACKGROUND OF THE INVENTION

The RF (radio or high frequency) power transistor is today a mature product that provides solid-state sources in kilowatt FM broadcast transmitters, TV transmitters, two-way mobile radios, cellular telephones, aircraft communications, radar, and a variety of military applications. Power levels to kilowatts attest to the advances in this area of the semiconductor industry in the last 25 years. Higher power and higher frequency operation are much desired.

The use of semiconductor devices for RF applications has increased dramatically as heat dissipation, size, dependability, and other improved characteristics have made such devices well-suited for many applications. Semiconductor transistors, including an emitter, a base, and a collector as the three, main components, are small; therefore, they are generally incorporated into packages. RF packages are used to hold semiconductor components, particularly transistors, and to provide readily available terminals for connection to other components.

In designing such packages, thermal management is critical—especially at high power generation levels which increase the amount of heat created. Heat decreases the performance and operating life of the transistor. Moreover, heat generated at the collector-base junction can create a temperature buildup which may eventually cause the device to short-circuit.

RF transistors often require, therefore, water-cooled assemblies to carry away the heat. Alternatively, the transistor may be mounted on a thermally conductive pad which acts as a heat sink and dissipates the heat generated by the transistor. In order to prevent electrical losses, however, the thermally conductive pad must also be electrically insulating. Hence, a thermally conducting, electrically insulating material is used for the mounting pad. Typically, that material is beryllia (beryllium oxide—BeO), although alumina (aluminum oxide—$Al_2O_3$) and, more recently, boron nitride (BN) have occasionally been used.

Beryllia (BeO) has better thermal conductivity than $Al_2O_3$ and, consequently, is more commonly used. Care must be taken in handling and processing BeO, however, because BeO is highly toxic. It can be hazardous to the human respiratory system when in the powder form created as the BeO pad is machined or ground. Proper equipment and safeguards are needed to insure that the BeO is handled safely and that improper contact with humans is avoided. The military has prohibited the use of BeO except under exceptional circumstances. There is a government-funded initiative to replace BeO with BN.

Another disadvantage of the prior art packages is that, when BeO is a component, a "thin" pad of BeO is used. The pad is attached to the heat sink by a preform, which creates two interfaces: pad-to-preform and preform-to-heat sink. These interfaces decrease the thermal conductivity of the connection and require extra processing steps.

Further, although BeO has a high thermal conductivity up to about 200° C. to 250° C., its performance decreases with increasing temperature. Attempts to drive the RF transistor past the normal operating level to higher power levels will fail, therefore, because the BeO pad becomes thermally saturated and unable to dissipate the heat generated. When heat dissipation fails, the RF transistor will slump and its power will simply drop off. Such a slump is typical of existing RF transistor packages.

To improve thermal management, diamond spreaders have been used. Diamond is an excellent thermal conductor which can be incorporated in the RF transistor package. A package using diamond will dissipate heat much faster than BeO and can achieve higher power levels without slumping. Diamond is, however, an expensive material. Its use indicates the importance of thermal management in high power RF transistor packages. The BeO pad used is generally about 1 to 1.5 mm thick. Such thickness is required because the mechanical strength of BeO is low. If insufficiently thick, the pad may crack or split either during attachment or later upon heating during use. Thus, the overall height of the RF package is increased when a BeO pad is used.

Most commonly, RF transistors operating in high power and frequency ranges are fabricated from several semiconductor die operating in parallel within a single housing or assembly. Large numbers of complex internal parts having high cost are used which require an excessive number of welded or soldered connections adversely affecting reliability. It would be desirable to create monolithic circuits in which the semiconductor die are operating on the same piece of substrate material.

RF transistors also typically have one or more top surface contacts and at least one bottom surface contact. Thus, a multi-plane terminal arrangement exists. Such an arrangement is troublesome because it requires more internal interconnections, increases lead length, and raises inductance. Parasitic couplings between input and output circuits cause losses and unwanted feedback effects which degrade performance. Single, top, planar surface contacts are desirable.

To improve upon the existing RF transistor packages, a new, bipolar, monolithic, high-power RF transistor with isolated top collector contacts is provided. An object of the present invention is to provide an improved transistor which operates efficiently and reliably even in high power and high frequency ranges. A related object is to improve thermal management in the RF transistor package, dissipating heat as rapidly as it is generated, by providing vertical isolation. Upon achieving these related objects, power slumps will be avoided.

Another object is to replace the typical thermally conducting, electrically insulating BeO mounting pad and, thereby, to avoid the problems inherent in using such a pad. Such replacement is preferably done without incorporating expensive materials such as diamond. Further objects are to use conventional planar processing steps and equipment, and to simplify those processing steps required, in manufacturing the improved RF transistor package. Simplification is possible, for example, by avoiding the typical step of attaching the BeO pad to the heat sink.

It is still another object of the present invention to provide all contacts, including an isolated collector, on the top surface of the package. Yet another object is to build an RF transistor on an intrinsic, electrically insulating substrate so that the transistor die can be mounted directly to the heat sink. A related object is to make the RF transistor into a monolithic circuit by laterally isolating the RF transistor; different electrical components can be placed on the same piece of substrate material. Such lateral isolation also solves the parasitic capacitance problem which is especially pronounced in high power RF transistors.

SUMMARY OF THE INVENTION

To achieve these and other objects, and in view of its purposes, the present invention provides an improved high frequency, high power transistor of the type having a bottom surface adapted for mounting on a metallic heat sink; a base region; a base metal contact electrically connected to the base region; an emitter region within the base region forming an emitter-base junction; an emitter metal contact electrically connected to the emitter region; a collector region forming a base-collector junction; a collector metal contact electrically connected to the collector region; and an insulating layer electrically isolating the base metal contact, the emitter metal contact, and the collector metal contact. The improvement, which achieves a vertically isolated transistor, includes a thermally conductive, electrically insulating substrate positioned directly on the heat sink, and upon which the transistor components (including collector, base, and emitter) are grown, and a planar top surface formed on the transistor by the base metal contact, the emitter metal contact, and the collector metal contact.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing, in which.

DETAILED DESCRIPTION OF THE INVENTION

Figure 1:
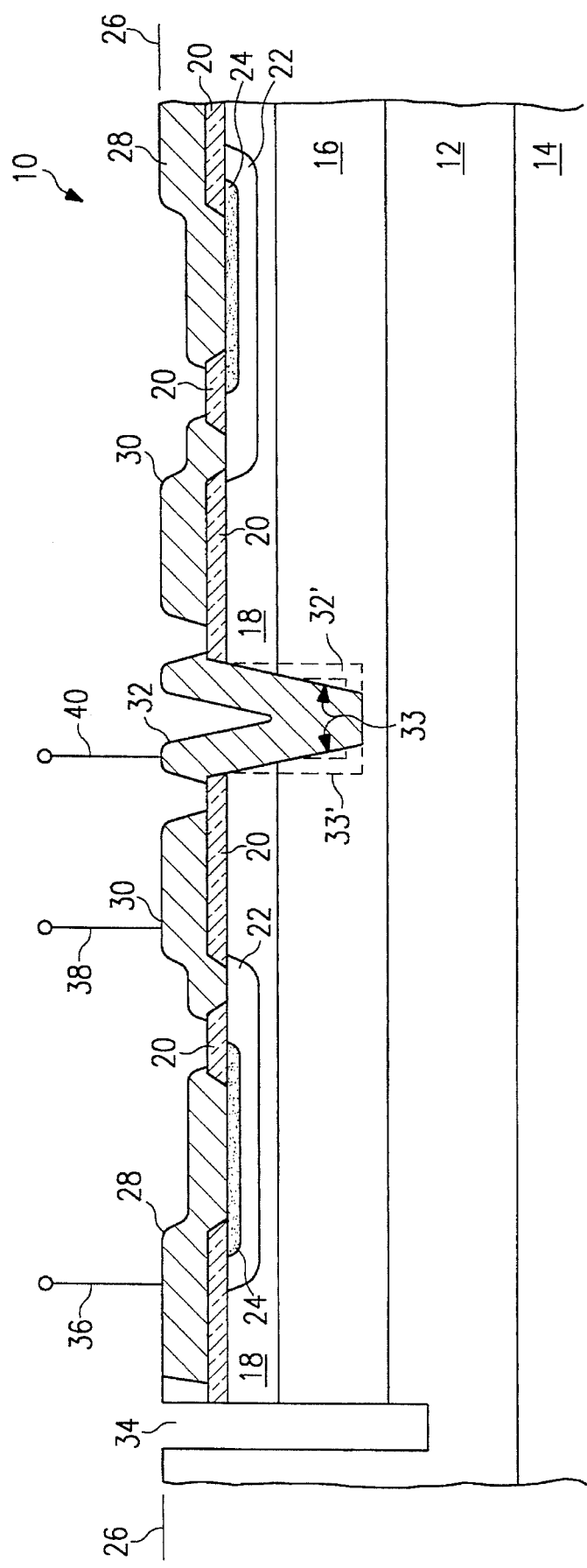
FIG. 1 is a cross-section view of a monolithic, high-power RF transistor with isolated top collector contacts according to the present invention.

FIG. 1 shows an embodiment of the present invention. It is emphasized that, according to common practice in semiconductor representation, the various layers of the drawing are not to scale. On the contrary, the width or length and thickness of the various layers are arbitrarily expanded or reduced for clarity.

The bipolar transistor is an electronic device with two p-n junctions in close proximity. Such a transistor has three active regions: an emitter, a base, and a collector. Typically, the two p-n junctions, the emitter-base and collector-base junctions, are in a single piece of semiconductor material and are separated by a certain distance. That distance is very important. It is almost always less than 10 μm and, for high-performance bipolar transistors, is usually less than 0.5 μm. Modulation of the current flow in one p-n junction by a change in the bias of the nearby junction is called bipolar-transistor action.

External leads can be attached to each of the three regions. Through such leads, input voltages and currents can be delivered to, and output voltages and currents can be taken from, the device. If the emitter and collector are doped n-type and the base is doped p-type, the device is called an n-p-n transistor—as shown in FIG. 1. If the opposite doping configuration is used, the device is a p-n-p transistor.

FIG. 1 shows that the starting material for the transistor 10 of the present invention is a highly thermally conductive, electrically insulating, "100"-oriented, intrinsic silicon substrate 12 having a resistivity greater than 1,000 ohm-cm. By using substrate 12, transistor 10 can be mounted directly to the heat sink 14 of the package without need of BeO. Heat sink 14 is typically a copper or elkonite flange.

All "intrinsic" materials have slight residual impurities. If an n-p-n transistor will be fabricated, intrinsic substrate 12 should have p-type residual impurities. If a p-n-p transistor will be fabricated, intrinsic substrate 12 should have n-type residual impurities. Thus, the slight residual impurities in intrinsic silicon substrate 12 are preferably of type opposite the doped type of the emitter and collector and like the doped type of the base. Such a preferred embodiment will reduce the potential leakage path.

Transistor 10 is manufactured using the wellknown planar process. The specific device dimensions, doping concentrations, and process sequences used to produce transistor 10 are those typical of the art; the parameters mentioned below are included to give an idea of the relative range of suitable characteristics.

The collector region consists of a heavily n-doped ($N^+$) subcollector layer 16 grown beneath a lightly n-doped epitaxial supercollector ($N^-$) layer 18. Both layers are typically n-type silicon. $N^+$ layer 16 has high conductivity, low resistivity, a thickness of approximately 200 to 10,000 μm, and a concentration of $10^{18}$ to $10^{19}$ dopant atoms per cubic centimeter. $N^-$ layer 18 is grown to a thickness of between 0.1 and 5 μm on $N^+$ layer 16 in a conventional fashion by using liquid or vapor phase epitaxy or by deposition of a polycrystalline layer followed by recrystallization (as disclosed in U.S. Pat. No. 4,651,410 issued to Feygenson). $N^-$ layer 18 may be doped to a concentration of $10^{15}$ to $10^{16}$ dopant atoms per cubic centimeter.

Although n-type material was chosen as the composition for the collector region for the purpose of illustration, it should be understood that p-type material may also be used. If so, the conductivity type of semiconductor materials and dopants would accordingly by reversed, thus producing a p-n-p, rather than an n-p-n, transistor.

The heavily doped collector region effectively stops thyristor action both through recombination and the reduction in injection efficiency from substrate 12 into the collector region. In addition, when the collector region is biased, a depletion region extends through substrate 12. The thickness of the depletion region controls the parasitic capacitance. When isolation grooves are used through the collector region, however, only the active area of the monolithic circuit affects the parasitic capacitance. A proper design limits that active area to about thirty percent of the chip area.

Once the collector region is in place, a base region 22 and an emitter region 24 are formed. Base 22 is a p-type silicon with a typical depth of 0.5 to 3.25 μm and a concentration of $10^{16}$ to $10^{19}$ atoms per cubic centimeter. Emitter 24 is an n-type silicon with a typical depth of 0.25 to 2.5 μm and a concentration of $10^{20}$ to $10^{22}$ atoms per cubic centimeter. By conventional thermal oxide growth, photolithography, and etching techniques, an insulating silicon dioxide layer 20 is provided with apertures above the regions where the integratable bipolar transistor is to be formed. Layer 20 may be approximately 0.2 to 6 μm thick and is preferably as thick as possible to decrease parasitic capacitance, especially at high frequencies.

Because the current flow paths within transistor 10 have significant resistivity, parasitic series resistances exist in each of the three main regions of the device. The collector series resistance, base series resistance, and emitter series resistance each must be as small as possible. Similar parasitic capacitances also exist and must be minimized.

The dopant used to create the n-type layers may be phosphorous, arsenic, antimony, or the like. Arsenic is often preferable because it has a lower diffusion coefficient, providing more abrupt base-emitter junctions, enhanced performance, and lower resistivity layers. Arsenic has a solid solubility 15 times higher than antimony and 1.5 times higher than phosphorous. Thus, arsenic is preferable because it renders more impurities available for current conduction. Boron is typically used as the dopant in the p-type base 22. Typical processes used to dope the various layers include deposition from gaseous or oxide sources, ion implantation, and diffusion to adjust concentrations and depths.

The emitter, base, and collector metal contacts are then formed—all in the top surface of transistor 10. Emitter metal contact 28, base metal contact 30, and collector metal contact 32 form a planar surface 26. Such placement facilitates the interface of transistor 10 with other components and reduces the overall dimensions of the transistor. Placement of collector metal contact 32 on the top surface of transistor 10 also reduces undesirable capacitative effects. Leads 36, 38, and 40 are then electrically attached to each of the three metal contacts.

Turning specifically to formation of the isolated collector metal contact 32, a groove 33 is first provided in the top of transistor 10. The groove extends through oxide 20, $N^-$ layer 18, and partly into $N^+$ layer 16. The electrical communication between collector metal contact 32, when formed in the groove, and $N^+$ layer 16 allows collection to occur. Collector metal contact 32 extends above oxide 20 to provide a top surface contact for external electrical communication. Metallization of the groove to form collector metal contact 32 is done using conventional physical vapor deposition processes such as sputtering and electron beam evaporation.

Typically, an etching process is used, such as reactive ion etching, to create the groove. Other processes are possible. If isotropic etching is used, the groove will be as wide as it is deep and will have a generally annular shape. Anisotropic etching is preferred. Wet anisotropic etching provides a V-shaped groove as shown in FIG. 1. Plasma or reactive ion etching can produce a groove, 33' as shown in phantom in FIG. 1) rectangular in shape, with a high width-to-depth aspect ratio. Typically, a 7 μm deep groove can have a top opening of 1 μm. Each groove shape has an advantage and a disadvantage.

The rectangular groove 33' uses less area than does the V-shaped groove. Consequently, more of substrate 12 is available to support the active transistor and transistor cells can be packed more closely together. On the other hand, it is very difficult to metallize a groove having a square cross-section. Although the V-shaped groove requires more area, it is easier to process and, specifically, to metallize. Good contact metallization is more reliably achieved using the V-shaped groove.

In either case, once the groove is formed it is metallized to yield a collector metal contact 32 (or 32', as shown in phantom in FIG. 1) having good ohmic contact to $N^+$ layer 16. The result is vertical isolation using a top collector and an electrically insulating substrate. Such vertical isolation solves the problem inherent in conventional RF transistors of thermal management: elimination of BeO and use of intrinsic silicon substrate 12 will achieve thermal improvements on the order of 40–60%.

Transistor 10 offers a number of distinct processing advantages as well. The processing steps used to produce transistor 10 are well-established, and fewer are required than for conventional transistors. Thus, increased yield is obtained. Vertical isolation allows transistor 10 to require less area than that of conventional transistors. Thus, increased packing density is obtained.

Transistor 10 also offers electrical advantages. A prototype successfully built with the design target parameters of 15 watts, 12.5 volts, and 175 megahertz provided an 8.5 db gain and 65% collector efficiency. It also showed excellent overdrive capability without power slump because the thermal management of the device was improved over conventional transistors packages. Similarly, it is expected that the cooler temperatures will increase the mean time to failure of the device and that the cooler junction temperatures will foster reliability.

Transistor 10 of the present device, which is vertically isolated, is well-adapted for lateral isolation. Lateral isolation would solve the capacitance problems inherent in conventional devices. Using principles similar to those discussed above with respect to vertical isolation, the RF transistor may be incorporated as part of a true RF "disc" or as part of a monolithic circuit or gain block. Lateral isolation permits additional transistors or different electrical devices to operate on the same substrate 12. Such lateral isolation between devices may be achieved in a variety of ways, such as by using a vertical trench 34, designed to isolate the electrically active regions of transistor 10 from similar regions in adjacent devices.

Although the invention is illustrated and described herein as embodied in a a bipolar, monolithic, high-power RF transistor having a planar top surface and a bottom surface adapted for mounting on a metallic heat sink, the transistor including a thermally conductive and electrically insulating substrate placed directly on the heat sink; a collector region of a semiconductor material of a first conductivity type grown on the substrate; a discrete base region of opposite conductivity type semiconductor material formed within the boundary of the collector region and defining therewith a base-collector junction; an emitter region of first conductivity type semiconductor formed within the boundary of the base region and defining therewith an emitter-base junction; an insulating layer overlying the exposed top surfaces of the base region, the emitter region, and the collector region with discrete apertures allowing isolated electrical contact to the base region, the emitter region, and the collector region; and a base metal contact, an emitter metal contact, and a collector metal contact forming a planar top surface of the transistor; whereby the transistor is vertically isolated, the invention is nevertheless not intended to be limited to the details shown. Rather, various modifications may be made in the details within the scope and range of equivalents of the claims and without departing from the spirit of the invention. Specifically, although the invention is described in connection with a bipolar transistor package, this is by way of example only, inasmuch as the invention may have application in appropriate instances to other semiconductor devices in similar configurations.

What is claimed is:

1. A bipolar, monolithic, high-power RF transistor having a bottom surface adapted for mounting on a heat sink, said transistor comprising:

a thermally conductive, electrically insulating silicon substrate having a bottom surface positioned directed on said heat sink, without an intervening ceramic layer;

a collector region, of a bipolar, high-power RF transistor, of a semiconductor material of a first conductivity type having an exposed top surface and a bottom surface formed on said substrate;

a discrete base region, of a bipolar, high-power RF transistor, of opposite conductivity type semiconductor material formed within the boundary of said collector region and defining therewith a base-collector junction, said base region having a top surface with portion exposed at said top surface of said collector region;

an emitter region, of a bipolar, high-power RF transistor, of said first conductivity type semiconductor material formed within the boundary of said base region and defining therewith an emitter-base junction, said emitter region having a top surface exposed at said top surface of said base region;

an insulating layer overlying said exposed top surfaces of said collector region, said base region, and said emitter region, said insulating layer having discrete apertures allowing isolated electrical contact to said base region, said emitter region, and said collector region;

a base metal contact having a top surface that defines a plane, such that no surface of the transistor is above said plane, said base metal contact:
(a) overlying said base region,
(b) electrically connected to said base region through a first aperture in said insulating layer, and
(c) overlying said insulating layer in areas where said base metal contact overlays said collector region;

an emitter contact located in said plane, said emitter metal contact:
(a) overlying said emitter region;
(b) electrically connected to said emitter region through a second aperture in said insulating layer,
(c) overlying said insulating layer in areas where said emitter metal contact overlays one of said collector region and said base region, and
(d) being insulated from said base metal contact by said insulating layer;

a collector metal contact located in said plane and electrically connected to said collector region through a third aperture in said insulating layer, said collector metal contact partly extending into said collector region, thereby defining a groove having a first sidewall, a second sidewall, and a bottom surface located within said collector region, said collector metal contact forming a continuous film along the first sidewall, the second sidewall, and the bottom surface of the groove, said collector metal contact being insulated from said base metal contact and from said emitter metal contact by said insulating layer; and external leads electrically connected to each of said base metal contact, said emitter metal contact, and said collector metal contact;

wherein said heat sink is metallic and is distinct from said collector, base and emitter metal contacts, said heat sink has no metallic conductive connection to any of said collector, base and emitter metal contacts, and said heat sink has sufficient thickness and extent to maintain said base-collector junction and said base-emitter junction within a desired temperature range;

whereby said transistor is vertically isolated.

2. A transistor according to claim 1 wherein said substrate is "100" oriented intrinsic silicon.

3. A transistor according to claim 2, wherein said substrate has a resistivity of at least 1000 ohm-centimeters.

4. A transistor according to claim 1 wherein said insulating layer is silicon dioxide.

5. A transistor according to claim 1 wherein said collector region has a subcollector layer formed of a heavily doped first conductivity type of semiconductor material grown on said substrate and a supercollector layer formed of a lightly doped first conductivity type of semiconductor material grown on said subcollector layer and wherein said base region is formed within the boundary of said supercollector layer and said collector metal contact extends through said supercollector layer into said subcollector layer.

6. A transistor according to claim 1 wherein said collector metal contact has an aspect ratio of about 1 to 7.

7. A transistor according to claim 6 wherein said collector metal contact is rectangular.

8. A transistor according to claim 1 wherein said collector metal contact is V-shaped.

9. An improved high frequency, high power transistor of the type having a bottom surface adapted for mounting on a heat sink; a base region; a base metal contact electrically connected to said base region; an emitter region within said base region forming an emitter-base junction; an emitter metal contact electrically connected to said emitter region; a collector region forming a base-collector junction; a collector metal contact electrically connected to said collector region; and an insulating layer electrically isolating said base metal contact, said emitter metal contact, and said collector metal contact; wherein the improvement comprises:

a thermally conductive, electrically insulating silicon substrate positioned directly on said heat sink without an intervening ceramic layer, and upon which substrate said collector region is grown and said base and emitter regions are formed, wherein said heat sink is metallic and is distinct from said collector, base, and emitter metal contacts, said heat sink has no metallic conductive connection to any of said collector, base and emitter metal contacts, and said heat sink has sufficient thickness and extent to maintain said emitter-base junction and said base-collector junction within a desired temperature range; and said base metal contact, said emitter metal contact, and said collector metal contact are each within a common exposed plane such that no surface in the transistor is above the plane, said collector metal contact partly extending into said collector region, thereby defining a groove having a first sidewall, a second sidewall, and a bottom surface located within said collector region, said collector metal contact forming a continuous film along the first sidewall, the second sidewall, and the bottom surface of the groove.

10. A transistor according to claim 9 wherein said substrate is "10038 oriented intrinsic silicon.

11. A transistor according to claim 9 wherein said insulating layer is silicon dioxide.

12. A transistor according to claim 9 wherein said collector region is of a semiconductor material of a first conductivity type, said base region is of opposite conductivity type semiconductor material, and said emitter region is of said first conductivity type semiconductor material.

13. A transistor according to claim 12 wherein said collector region has a subcollector layer formed of a heavily doped said first conductivity type of semiconductor material grown on said substrate and a supercollector layer formed of a lightly doped said first conductivity type of semiconductor material grown on said subcollector layer and wherein said base region is formed within the boundary of said supercollector layer and said collector metal contact extends through said supercollector layer into said subcollector layer.

14. A transistor according to claim 9 wherein said collector metal contact has an aspect ratio of about 1 to 7.

15. A transistor according to claim 14 wherein said collector metal contact is rectangular.

16. A transistor according to claim 9 wherein said collector metal contact is V-shaped.

17. A bipolar, monolithic, high-power RF transistor disc comprising:

a plurality of bipolar, monolithic, high-power RF transistors according to claim 1 wherein said transistors operate on a single thermally conductive, electrically insulating substrate; and means for vertically isolating each of said RF transistors from adjacent RF transistors.

18. A bipolar, monolithic, high-power RF transistor disc according to claim 17 wherein said vertical isolating means is a vertical trench.

19. A monolithic circuit comprising:

a bipolar, monolithic, high-power RF transistor according to claim 1 wherein at least one other electrical component operates on said thermally conductive, electrically insulating substrate of said transistor; and means for vertically isolating said RF transistor from said other electrical component.

20. A monolithic circuit according to claim 19 wherein said vertical isolating means is a vertical trench.

* * * * *